United States Patent [19]

Chamberlain, IV

[11] Patent Number: 5,610,518
[45] Date of Patent: Mar. 11, 1997

[54] METHOD AND APPARATUS FOR DETECTING SMALL MAGNETIZABLE PARTICLES AND FLAWS IN NONMAGNETIC CONDUCTORS

[75] Inventor: Frederick R. Chamberlain, IV, Vista, Calif.

[73] Assignee: Eastman Kodak Company, Rochester, N.Y.

[21] Appl. No.: 405,461

[22] Filed: Mar. 16, 1995

[51] Int. Cl.$^6$ ............................ G01N 27/82; G01R 33/12
[52] U.S. Cl. ............................................. 324/235; 324/241
[58] Field of Search ...................................... 324/235, 240, 324/241, 242, 238, 262

[56] References Cited

U.S. PATENT DOCUMENTS

| | | | |
|---|---|---|---|
| 3,419,798 | 12/1968 | Walton | 324/45 |
| 3,849,724 | 11/1974 | Ghibuet et al. | 324/34 D |
| 4,093,917 | 6/1978 | Haeussermann | 324/173 |
| 4,270,088 | 5/1981 | Weischedel | 324/241 |
| 4,503,393 | 3/1985 | Moyer et al. | 324/235 |
| 4,535,289 | 8/1985 | Abe et al. | 324/208 |
| 4,739,723 | 4/1988 | Peterson et al. | 324/242 |
| 4,785,242 | 11/1988 | Vaidya et al. | 324/208 |
| 4,859,941 | 8/1989 | Higgs et al. | 324/208 |
| 4,943,772 | 7/1990 | Maupu et al. | 324/207.2 |
| 4,970,463 | 11/1990 | Wolf et al. | 324/207.2 |
| 5,128,613 | 7/1992 | Takahashi | 324/235 |
| 5,192,877 | 3/1993 | Bittebierre et al. | 307/309 |
| 5,304,926 | 4/1994 | Wu | 324/207.2 |

*Primary Examiner*—Walter E. Snow
*Attorney, Agent, or Firm*—William F. Noval

[57] ABSTRACT

A pair of Hall sensors are symmetrically positioned between the poles of a horseshoe magnet. The Hall sensors are mounted in a plane flush with the ends of the magnet faces, and are located equidistant from the centerline of the magnet. A small magnetic object in the field of the magnet, preferably located on the magnet axis, has an induced dipole moment which is detected by the Hall sensors. The small magnetic object dipole field is such that the flux at each Hall sensor is in opposite directions, and by differentially sensing the outputs of the Hall sensors, a signal proportional to the magnetic object is derived. Leakage flux from the magnet as well as the flux of the earth's magnetic field, are in the same direction at both Hall sensors, and their effects are zeroed out by the differential sensing of the Hall sensors' outputs. When the poles of the magnet are drawn across the surface of a non magnetic sheet of conductive material, eddy currents are induced in the sheet by the moving magnetic field. Due to the symmetry of the magnet/sensor arrangement, in a uniform sheet these currents generate identical magnetic fields which result in sensor outputs that cancel. However, a crack or other anomaly in the sheet results in unequal signals at the two sensors, and an output signal proportional to the anomaly occurs.

2 Claims, 2 Drawing Sheets

METHOD AND APPARATUS FOR DETECTING SMALL MAGNETIZABLE PARTICLES AND FLAWS IN NONMAGNETIC CONDUCTORS

BACKGROUND OF THE INVENTION

1. Field of the Invention

This invention relates to magnetic field measurement, and in particular to detection of a magnetic field due the presence of a magnetic object or due to the presence of an anomaly discontinuity in a moving conductive sheet.

2. Description Relative to the Prior Art

A wide variety of devices for detection of a magnetic object exist in the art. Applications widely range from detecting the position of teeth in a rotating gear, (U.S. Pat. No. 5,304,926) to measuring the separation of a railroad car axle from the railroad track (U.S. Pat. No. 4,943,772). The technique employed and the configuration of the implemented hand are strongly depend upon the size of the object to be detected, and its separation from the measurement device.

The present invention is directed towards the detection of a small magnetic object under conditions where the detector may be brought into close proximity to the region thought to include the magnetic particle. It may be applied in the medical field there doctors need a means to sense the presence of foreign magnetic material within a patient, particularly within the eyes, before placing the patient in the large magnetic field of a diagnostic scanner. The large field gradient of the scanner can cause the magnetic object to move and inflict injury. The invention can also be used before and during surgery to detect and locate a magnetic object within a patient.

The structure of the present invention may also be used to detect an anomaly in the eddy current magnetic field due to a crack or other discontinuity in a moving planar sheet of electrically conductive material.

SUMMARY OF THE INVENTION

A pair of Hall sensors are symmetrically positioned between the poles of a horseshoe magnet. The Hall sensors are mounted in a plane flush with the ends of the magnet faces, and are located equidistant from the centerline of the magnet. A small magnetic object in the field of the magnet, preferably located on the magnet axis, has an induced dipole moment which is detected by the Hall sensors. The small magnetic object dipole field is such that the flux at each Hall sensor is in opposite directions, and by differentially sensing the outputs of the Hall sensors, a signal proportional to the magnetic object is derived. Leakage flux from the magnet as well as the flux of the earth's magnetic field, are in the same direction at both Hall sensors, and their effects are zeroed out by the differential sensing of the Hall sensors' outputs.

When the poles of the magnet are drawn across the surface of a non magnetic sheet of conductive material, eddy currents are induced in the sheet by the moving magnetic field. Due to the symmetry of the magnet/sensor arrangement, in a uniform sheet these currents generate identical magnetic fields which result in sensor outputs that cancel. However, a crack or other anomaly in the sheet results in unequal signals at the two sensors, and an output signal proportional to the anomaly occurs.

BRIEF DESCRIPTION OF THE DRAWINGS

The invention will be described with respect to the drawings of which.

DESCRIPTION OF PREFERRED EMBODIMENTS

Figure 1:
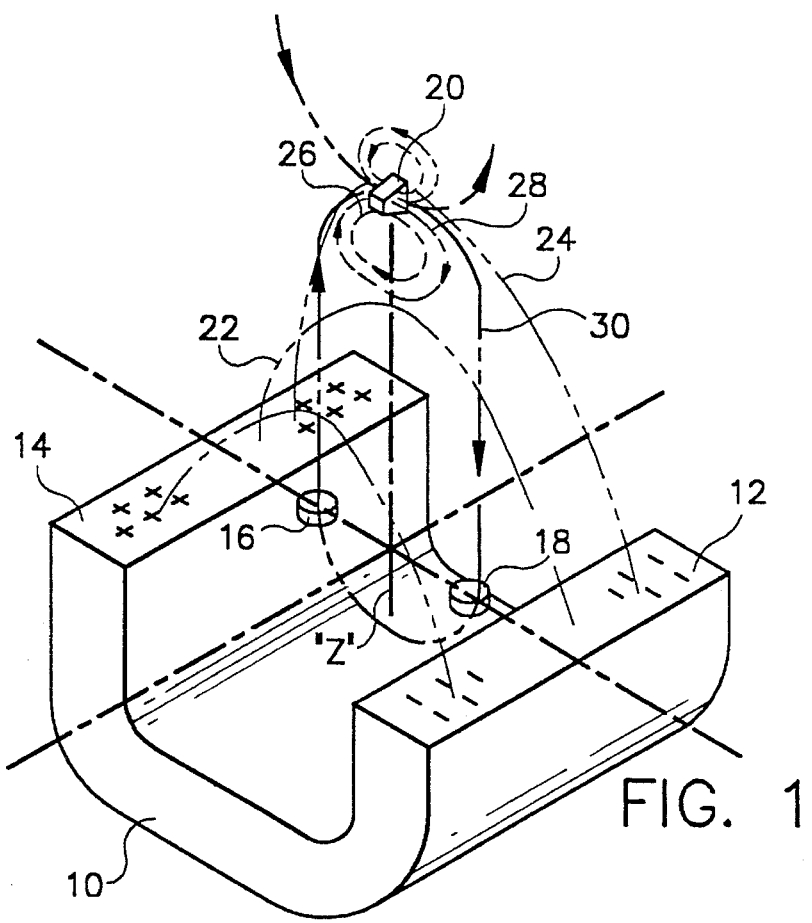
FIG. 1 is the drawing of the apparatus of the invention used in detecting the presence of a magnetic object.

Referring to FIG. 1, a permanent horseshoe magnet 10 has coplanar pole faces 12, 14. The magnet 10 is preferably made of high coercivity material, so that its leakage flux is minimum, i.e., substantially all flux enters and leaves the magnet at the faces 12,14. A pair of Hall sensors 16,18 are located in a plane that is coplanar with the pole faces 12,14; the sensors 16,18 being symmetrically positioned with respect to the magnet pole faces 12,14. The sensitive axes of the Hall sensors 12,14 are parallel to the "z" direction, and along orthogonal directions to the "z" axis there is no sensor response. (The sensitive direction is perpendicular to the top surface of the Hall sensors 16,18, as seen in FIG. 1.) As stated above, the magnet 10 material is selected to have minimum leakage flux, and it will be noted that the largest component of any residual leakage flux is along an insensitive direction for the Hall sensors 16,18.

A small magnetic object 20 to be detected is shown on the "z" axis, and is influenced by the field, e.g. 22,24 of the magnet 10, which induces a responsive dipole field in the magnetic object 20. Typical field lines of the induced dipole field are 26,28,30. Notice the field line 30 is in the minus "z" direction as it enters the Hall sensor 18, and in the plus "z" direction as it enters the Hall sensor 16. The output signals from the Hall sensors are differentially detected so that the preceding field signals add, indicating the presence of the magnetic object 20, while signals from external magnet fields, such as the earth's magnetic field, which enter the sensors in the same directions, and thermal effects in the sensors are zeroed out.

Figure 2:
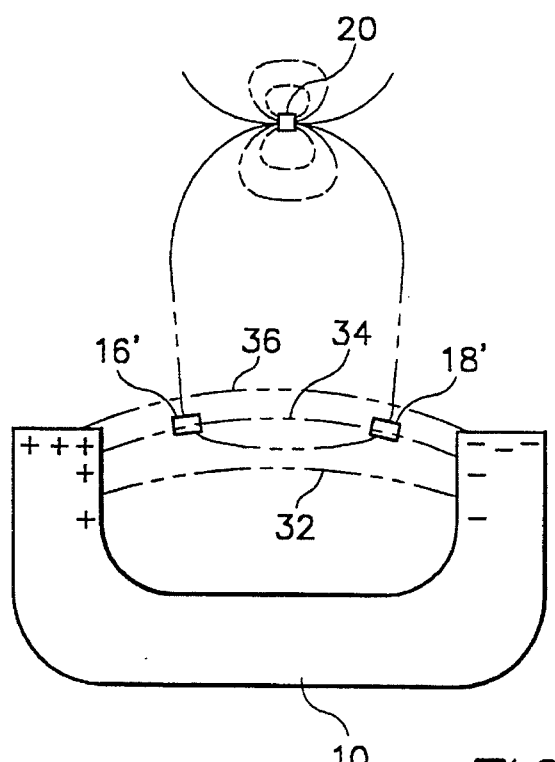
FIG. 2 is a drawing of a second embodiment of apparatus of the invention.

Referring to FIG. 2, a magnet 10', characterized by a larger fringing field than the magnet 10 of FIG. 1, is provided with Hall sensors 16, 18' in a second embodiment of the invention. (In the drawings, different but related elements have the same reference numbers, albeit they are distinguished by primes.) Curving field lines 32,34,36 bridge across the U of the magnet, and rather than placement of the Hall sensors flush with the end faces of the magnet 10, the elements 16',18' are cocked so that the fringing field line, e.g. 34 runs parallel to the top surfaces of the Hall sensors instead of the top surfaces being flush with the magnet end faces. In this way, the fringing flux has no component along the sensitive axes of the Hall sensors 16',18', and the invention may be implemented in terms of a less expensive magnet which may have an appreciable fringing field.

Figure 3:
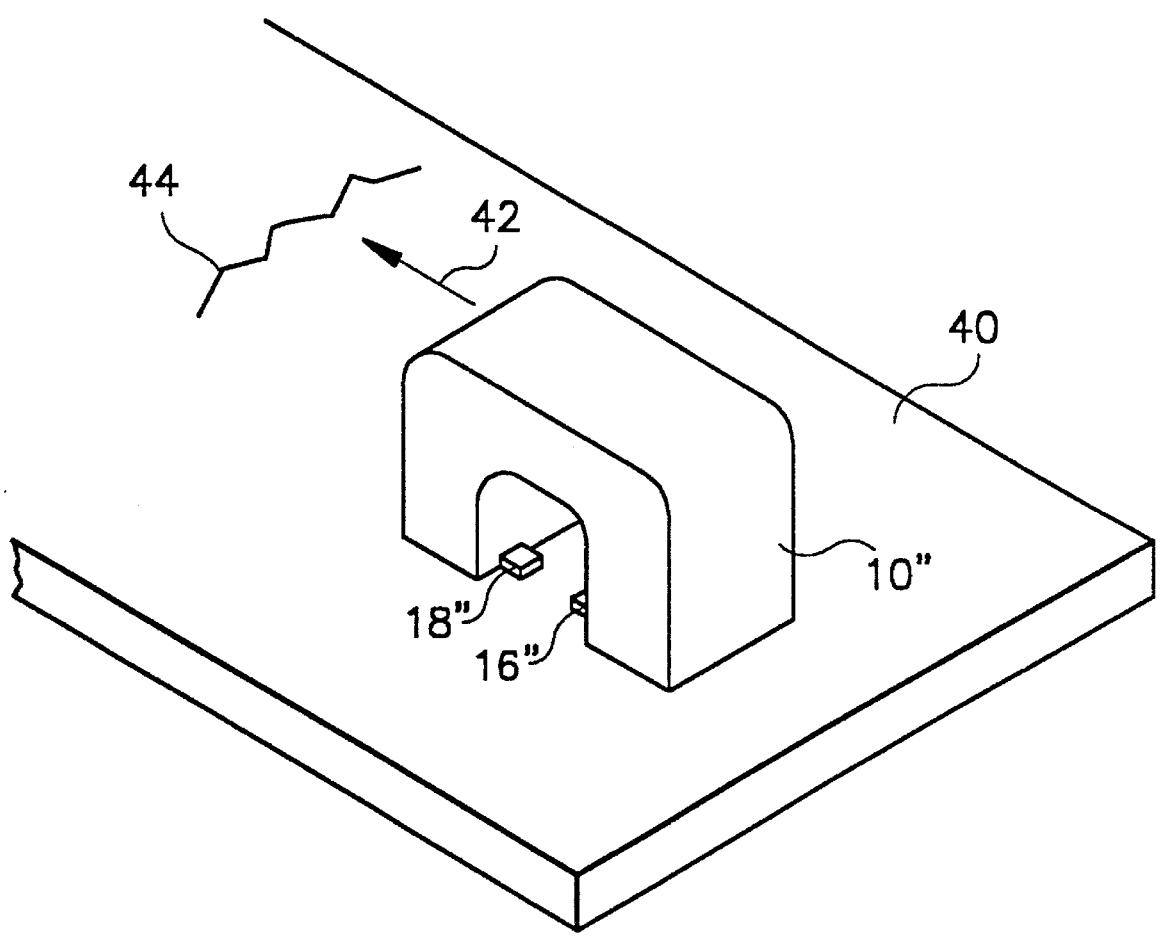
FIG. 3 is a drawing illustrating the use of the invention in detection of a crack in a planar sheet of non magnetic material.

Referring to FIG. 3, a magnet 10", and sensors 16",18" mounted flush with the pole faces of the magnet 10" are shown in contact with a planar conductive non magnetic sheet 40. By moving the magnet 10", for example in the direction of the arrow 42 across the surface of the sheet 40, eddy currents having resultant magnet fields are generated by the changing flux in the sheet 40. If the sheet is homogeneous, the resultant fields appear identical at the Hall sensors 16",18" and there is no detectable output from the differentially sensed Hall effect sensors 16",18". But a crack 44 results in distortion of the eddy current generated fields, and the field at one Hall sensor 16" will differ from that at the other Hall sensor 18". In this way the presence of the crack 44 or other anomaly may be detected.

The invention has been described in detail with particular reference to preferred embodiments thereof, but it will be understood that variations and modifications can be effected within the spirit and scope of the invention.

What is claimed is:

1. A method of determining the presence of a crack or other structural anomaly in a sheet of electrically conductive NONMAGNETIC material comprising the steps of:
   a) sweeping the coplanar pole faces of a horseshoe magnet across the surface to said sheet to induce eddy currents in said sheet,
   b) detecting the presence of first and second magnetic fields arising from said eddy currents by first and second matched Hall elements located between said first and second Dole faces of said horseshoe magnet and coplanar therewith,
   c) comparing a first response of said first Hall element to said first magnetic field to a second response of said second Hall element to said second magnetic field whereby a difference in said first response and said second response is indicative of a crack or other structural anomaly in said conductive non-magnetic sheet.

2. Apparatus for detecting small magnetizable particles comprising:
   a permanent horseshoe magnet having first and second coplanar pole faces, said magnet being made of high coercivity material so that its leakage flux is minimal;
   first and second Hall sensors located between said first and second pole faces and in a plane that is coplanar with said first and second pole faces of said magnet, said sensors being symmetrically positioned with respect to said first and second pole faces, and having sensitive axes perpendicular to said plane; and
   a small metal object to be detected located on the axis of said permanent magnet, in which an induced dipole moment by said magnet is differentially detected by said Hall sensors;
   wherein said outputs of said detectors are additive and wherein any signal produced by said sensors due to the earth's magnetic field or fringing fields from said magnet are canceled.

* * * * *